United States Patent [19]
Ashizawa

[11] Patent Number: 5,387,823
[45] Date of Patent: Feb. 7, 1995

[54] FUSE-PROGRAMMABLE REDUNDANCY CONTROL CIRCUIT

[75] Inventor: Yuichi Ashizawa, Tokyo, Japan

[73] Assignee: Oki Electric Industry Co., Ltd., Tokyo, Japan

[21] Appl. No.: 132,111

[22] Filed: Oct. 5, 1993

[30] Foreign Application Priority Data

Oct. 8, 1992 [JP] Japan .................. 4-270047

[51] Int. Cl.$^6$ ........................... H03K 19/003
[52] U.S. Cl. ........................ 326/13; 365/200; 326/106; 326/38; 327/525; 327/526
[58] Field of Search ............ 307/202.1, 441, 443, 307/449, 465; 365/200

[56] References Cited

U.S. PATENT DOCUMENTS

| | | | |
|---|---|---|---|
| 4,228,528 | 10/1980 | Cenken et al. | 307/441 X |
| 4,546,455 | 10/1985 | Iwahashi et al. | 365/200 |
| 4,651,030 | 3/1987 | Mimoto | 307/449 |
| 4,689,494 | 8/1987 | Chen et al. | 307/202.1 |
| 4,714,983 | 12/1987 | Chung | 307/441 |
| 4,791,319 | 12/1988 | Tagami et al. | 307/449 X |
| 5,058,059 | 10/1991 | Matsuo et al. | 307/441 X |
| 5,173,616 | 12/1992 | Hinooka | 307/202.1 |
| 5,257,229 | 10/1993 | McClure et al. | 365/200 |
| 5,262,994 | 11/1993 | McClure | 365/200 |
| 5,276,360 | 1/1994 | Fujima | 307/441 |

FOREIGN PATENT DOCUMENTS 3-130999  6/1991  Japan .................. G11C 29/00

Primary Examiner—David R. Hudspeth
Attorney, Agent, or Firm—Edward D. Manzo

[57] ABSTRACT

A fuse-programmable control circuit has a master control circuit with a first fusible link that controls the feeding of power to a fuse-programmable memory. If output of signals from the fuse-programmable memory is not required, the first fusible link is cut. If output of signals from the fuse-programmable memory is required, the first fusible link is left uncut and the fuse-programmable memory is programmed by cutting one fusible link in each of a number of pairs of fusible links. In either case, no current can flow through the fuse-programmable control circuit.

20 Claims, 4 Drawing Sheets

FUSE-PROGRAMMABLE REDUNDANCY CONTROL CIRCUIT

BACKGROUND OF THE INVENTION

This invention relates to a semiconductor integrated circuit having a fuse-programmable control circuit for generating fuse-programmable signals, more particularly to an improved control circuit that simplifies the programming process when the fuse-programmable signals are not required.

Fuse-programmable control circuits are used, for example, to repair multi-megabit memories and other very-large-scale integrated circuits. Such repair can greatly increase production yields. Typically, the repair process involves programming a fuse-programmable memory to output a set of signals that cause redundant circuit elements to be selected in place of defective circuit elements.

One well-known type of fuse-programmable memory comprises a plurality of pairs of fusible links, the two links in each pair being coupled in series between a power-supply node and a ground node. An output signal is generated from a point between the two links. Programming is performed by cutting either the link near the power-supply node, making the output signal low, or the link near the ground node, making the output signal high.

A problem with this scheme is that to prevent unwanted current flow through the fuse-programmable memory, one fusible link in each pair must always be cut, even if the integrated circuit has no defective elements and requires no repair. In a defect-free integrated circuit, this need for a large number of link-cutting operations adds unnecessarily to the time, difficulty, and cost of manufacture.

SUMMARY OF THE INVENTION

It is accordingly an object of the present invention to generate a set of fuse-programmable signals without requiring unnecessary cutting of fusible links when the fuse-programmable signals are not needed.

The invented control circuit has a master control circuit with a first fusible link coupled to a first potential. This first fusible link is left uncut if the fuse-programmable signals are required, and is cut if the fuse-programmable signals are not required.

The control circuit also has a fuse-programmable memory comprising a plurality of pairs of fusible links and a like plurality of output terminals for output of the fuse-programmable signals. Each output terminal is disposed between two paired fusible links. Each pair of fusible links is coupled in series to a second potential. When required, the fuse-programmable signals are programmed by cutting one or another of the fusible links in each pair. When the fuse-programmable signals are not required, the fusible links in the fuse-programmable memory are left uncut.

According to a first aspect of the invention, the pairs of fusible links in the fuse-programmable memory are coupled through a switching element to the first potential. The switching element is controlled by the master control circuit, being switched on if the first fusible link is uncut and off if the first fusible link is cut.

According to a second aspect of the invention, the pairs of fusible links in the fuse-programmable memory are coupled directly to the first fusible link.

DETAILED DESCRIPTION OF THE INVENTION

Embodiments of the invention will be described with reference to the attached drawings, which show the invention integrated into a semiconductor memory device. These drawings do not restrict the scope of the invention, which should be determined solely from the appended claims.

Figure 1:
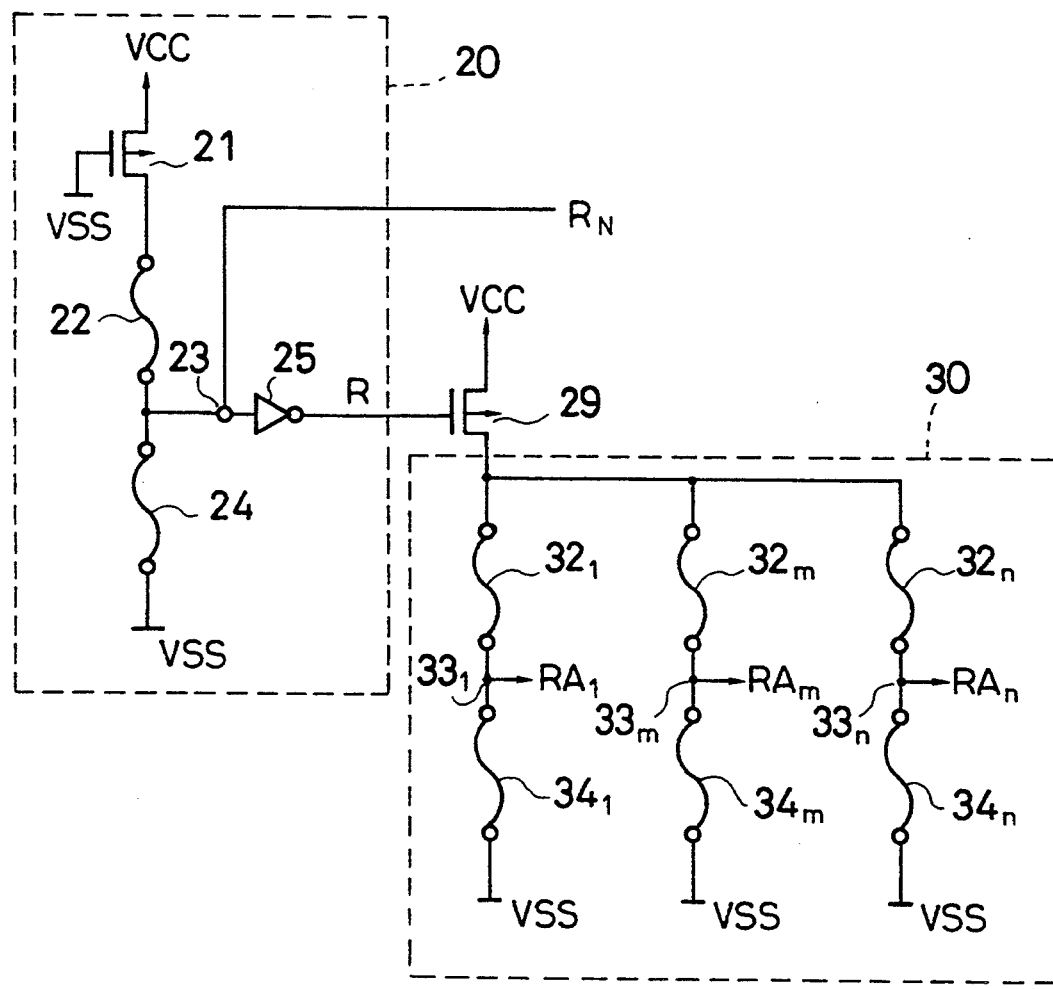
FIG. 1 is a schematic diagram illustrating a novel fuse-programmable control circuit.

Referring to FIG. 1, the invented fuse-programmable control circuit has a master control circuit 20 comprising a p-channel metal-oxide-semiconductor field-effect transistor (hereinafter, PMOS transistor) 21, a first fusible link 22, a master output terminal 23, a second fusible link 24, and an inverter 25. The PMOS transistor 21, first fusible link 22, and second fusible link 24 are coupled in series in the stated order between a first potential (VCC) and a second potential (VSS). The gate electrode of the PMOS transistor 21 is coupled to VSS. The master output terminal 23 is coupled to a point between the first fusible link 22 and second fusible link 24 and is used for the output of two complementary control signals, R and $R_N$. Of these, $R_N$ is output directly from the master output terminal 23; R is first inverted by the inverter 25. $R_N$ is active high; R is active low.

VCC and VSS are commonly referred to as the power-supply and ground potentials, respectively, VCC being higher than VSS. Each of these potentials is supplied to a plurality of nodes, including the various nodes labeled VCC and VSS in FIG. 1. For economy of expression it is customary to omit mention of these nodes and refer to circuit elements simply as being coupled to VCC or VSS.

The control signal R is supplied to a switching element, more specifically to the gate of a PMOS transistor 29, the source of which is coupled to VCC. When R is active (low), the PMOS transistor 29 is switched on and supplies the first potential VCC at its drain.

The drain of the PMOS transistor 29 is coupled to a fuse-programmable memory 30 comprising a plurality of fusible links $32_1, \ldots, 32_n$, a like plurality of output terminals $33_1, \ldots, 33_n$, and another plurality of fusible links $34_1, \ldots 34_n$ that are paired with the first plurality. Each pair of fusible links $32_m$ and $34_m$ (m = 1, . . . , n) is coupled in series between the PMOS transistor 29 and VSS. The m-th output terminal $33_m$ is disposed between the two paired fusible links $32_m$ and $34_m$. The signals output from the output terminals are fuse-programmable signals designated $RA_1 \ldots, RA_n$.

Figure 2:
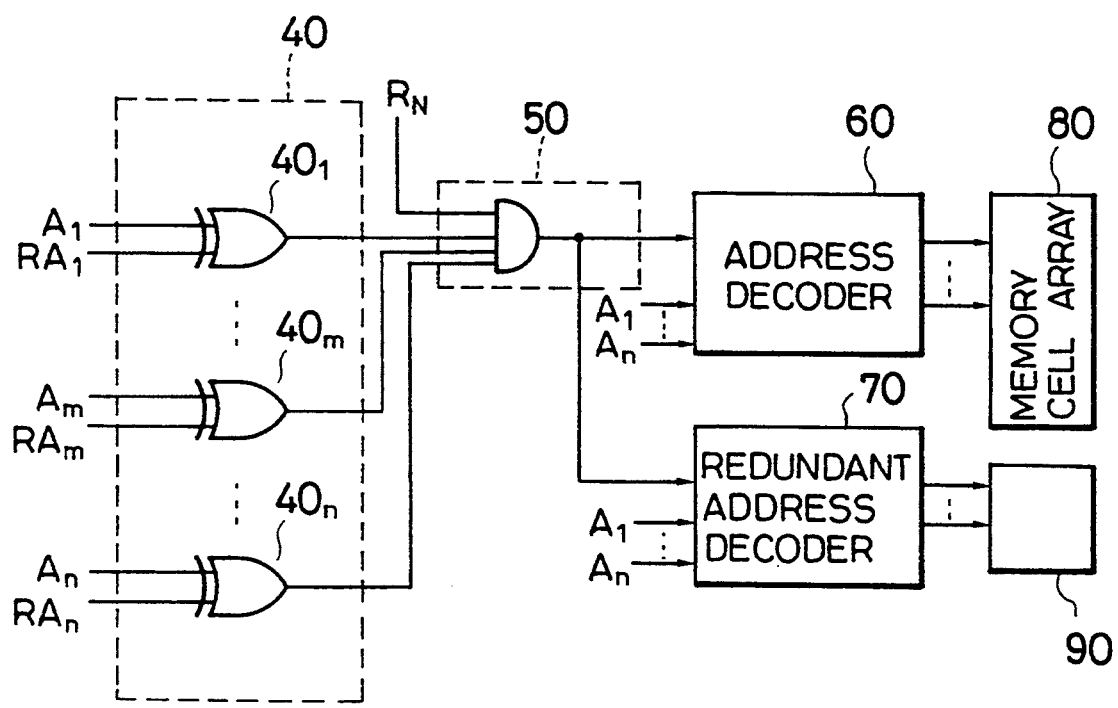
FIG. 2 is a block diagram of a semiconductor memory device incorporating the novel fuse-programmable control circuit.

Referring to FIG. 2, when the fuse-programmable control circuit is integrated into a semiconductor memory device, the device comprises, in addition to the elements shown in FIG. 1, an address comparator 40 having a plurality of exclusive-OR gates $40_1 \ldots, 40_n$, a decision circuit 50, a non-redundant address decoder 60, a redundant address decoder 70, a memory cell array 80, and a redundant memory cell array 90. The memory cell array 80 comprises a plurality of memory cells linked to a grid of intersecting word lines and bit lines. The redundant memory cell array 90 comprises one or more redundant memory cells, word lines, or bit lines. The structure of the non-redundant address decoder 60, redundant address decoder 70, memory cell array 80, and redundant memory cell array 90 is well known from the prior art, so further details will be omitted.

FIG. 2 has been considerably simplified to avoid obscuring the invention with unnecessary detail. For example, the decision circuit 50 is shown as comprising a single (n+1)-input AND gate, a configuration suitable when there is only a single redundant element to be selected. When there is more than one redundant element the decision circuit 50 will have a more complex structure.

The address comparator 40 receives the fuse-programmable signals $RA_1, \ldots RA_n$ from the fuse-programmable memory 30 in FIG. 1 and compares then with a set of address signals $A_1, \ldots, A_n$. The output of the m-th exclusive-OR gate $40_m$ is high if $A_m$ matches $RA_m$ and low if they do not match. The outputs of all the exclusive-OR gates $40_1 \ldots 40_n$ are sent to the decision circuit 50, together with the control signal $R_N$ from the master control circuit 20 in FIG. 1. $R_N$ indicates whether the fuse-programmable signals $RA_1 \ldots RA_n$ are valid, and accordingly whether the outputs of the exclusive-OR gates $40_1, \ldots 40_n$ are valid or invalid.

In the simplified configuration shown in FIG. 2, the number of address signals is equal to the number of fuse-programmable signals, but this need not be true in general.

The decision circuit 50 operates on the control signal $R_N$ and the outputs of the address comparator 40 to generate a signal that activates either the non-redundant address decoder 60 or the redundant address decoder 70. In FIG. 2 the output of the decision circuit 50 is high, activating the redundant address decoder 70, if all inputs to the decision circuit 50 are high, and low, activating the non-redundant address decoder 60, in other cases.

The non-redundant address decoder 60 and redundant address decoder 70 both receive the address signals $A_1, \ldots, A_n$. When the non-redundant address decoder 60 is activated, it decodes these address signals to select a normal element, such as a word line, bit line, or memory cell, in the memory cell array 80. When the redundant address decoder 70 is activated, it decodes the address signals to select a redundant element in the redundant memory cell array 90.

Next the operation of the invented control circuit will be described.

The manufacturer of a semiconductor memory device employing the invented control circuit tests the device before it is packaged. During the test all the fusible links in FIG. 1 are left uncut. The PMOS transistor 21 has sufficient on-resistance to limit current flow through the master control circuit 20 to an acceptable amount. Because of the resistance of the PMOS transistor 21, the control signal $R_N$ is low and R is high. Control signal R therefore switches off PMOS transistor 29, so that no current flows from VCC to VSS through the fuse-programmable memory 30. Control signal $R_N$ forces the output of the decision circuit 50 in FIG. 2 to the low state, activating the non-redundant address decoder 60, so that the normal memory cell array 80 can be tested.

If the test indicates no defective elements in the memory cell array 80, the first fusible link 22 in the master control circuit 20 in FIG. 1 is cut, and the fusible links in the fuse-programmable memory 30 are left uncut. The cutting can be done by, for example, a beam of laser light. The cut leaves the master output terminal 23 coupled to VSS and decoupled from VCC, so the above-described control-signal states become permanent. R is high, switching off the PMOS transistor 29 and preventing current flow from VCC to VSS through the fuse-programmable memory 30. Since the first fusible link 22 is cut, no current flows from VCC to VSS through the master control circuit 20 either. $R_N$ is low, so the decision circuit 50 activates the non-redundant address decoder 60. Normal operation, with no current leakage through the control circuit, is thereby obtained by cutting a single fusible link 22.

If the test indicates a defective element at a certain address in the memory cell array 80, this address is programmed into the fuse-programmable memory 30. Specifically, if the m-th address bit of the defective element is a logic one, fusible link $34_m$ is cut and fusible link $32_m$ is left uncut, so that the m-th fuse-programmable signal $RA_m$ will be high. If the m-th address bit of the defective element is a logic zero, fusible link $32_m$ is cut and fusible link $34_m$ is left uncut, so that $RA_m$ will be low.

In the master control circuit 20, the second fusible link 24 is cut and the first fusible link 22 is left uncut, so that $R_N$ is high and R is low. The PMOS transistor 29 is accordingly switched on, supplying power to the fuse-programmable memory 30. However, no current flows from VCC to VSS through the master control circuit 20, because the second fusible link 24 is cut, and no current flows from VCC to VSS through the fuse-programmable memory 30, because one fusible link in each pair of fusible links is cut.

During operation, each time the memory device is accessed, the input address signals $A_1, \ldots A_n$ are compared with the signals $RA_1, \ldots, RA_n$ output from the fuse-programmable memory 30. If the two sets of signals match, indicating access to a defective element, then the outputs from the address comparator 40 in FIG. 2 are all high. Since $R_N$ is also high, the output of the decision circuit 50 is high, activating the redundant address decoder 70, so a redundant element in the redundant memory cell array 90 is selected instead of the defective element in the memory cell array 80. If the two sets of signals do not match, indicating access to a non-defective element, then the output of the decision circuit 50 is low, activating the non-redundant address decoder 60, so that the memory cell array 80 is accessed.

Figure 3:
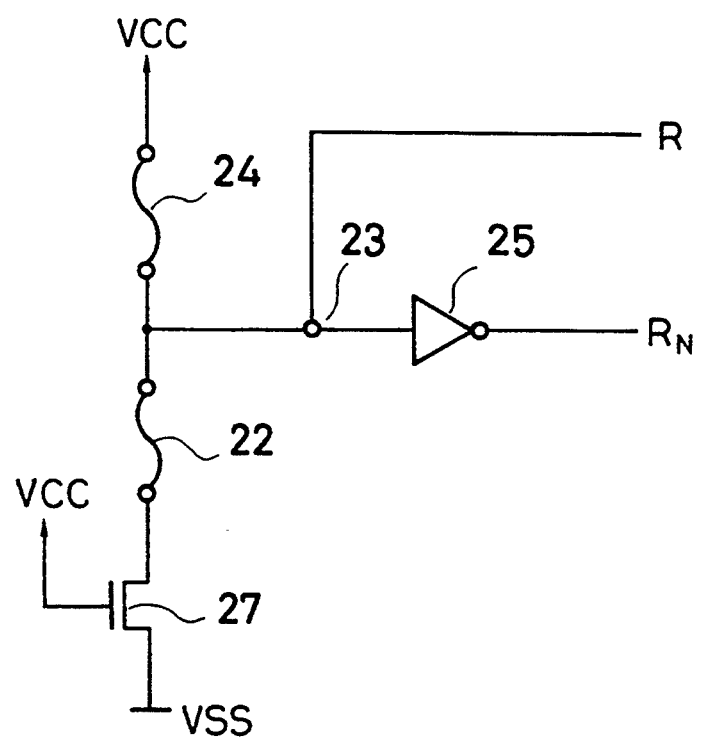
FIG. 3 is a schematic diagram illustrating a variation of the master control circuit in FIG. 1.

FIG. 3 shows a variation of the master control circuit 20 in FIG. 1, in which the order of the first fusible link 22 and second fusible link 24 is reversed. The second fusible link 24 is now coupled to VCC. The first fusible link 22 is coupled through an n-channel metal-oxide-semiconductor field-effect transistor (NMOS transistor) 27 to VSS. The gate electrode of the NMOS transistor 27 is coupled to VCC, so that the NMOS transistor 27 is always on. The NMOS transistor 27 has the same current-limiting function as the PMOS transistor 21 in FIG. 1.

This circuit operates like the master control circuit 20 in FIG. 1 except that the arrangement of its outputs is reversed: R is now obtained directly from the master output terminal 23, and $R_N$ from the inverter 25. As before, the first fusible link 22 is cut, making R high and $R_N$ low, if tests indicate no defects to be repaired. The second fusible link 24 is cut, making R low and $R_N$ high, if repair is required.

It is possible to reconfigure the logic circuits shown in FIG. 2 so that the decision circuit 50 can receive the control signal R instead of $R_N$. In that case $R_N$ is not needed, so the circuit in FIG. 3 can be simplified by omitting the inverter 25.

Figure 4:
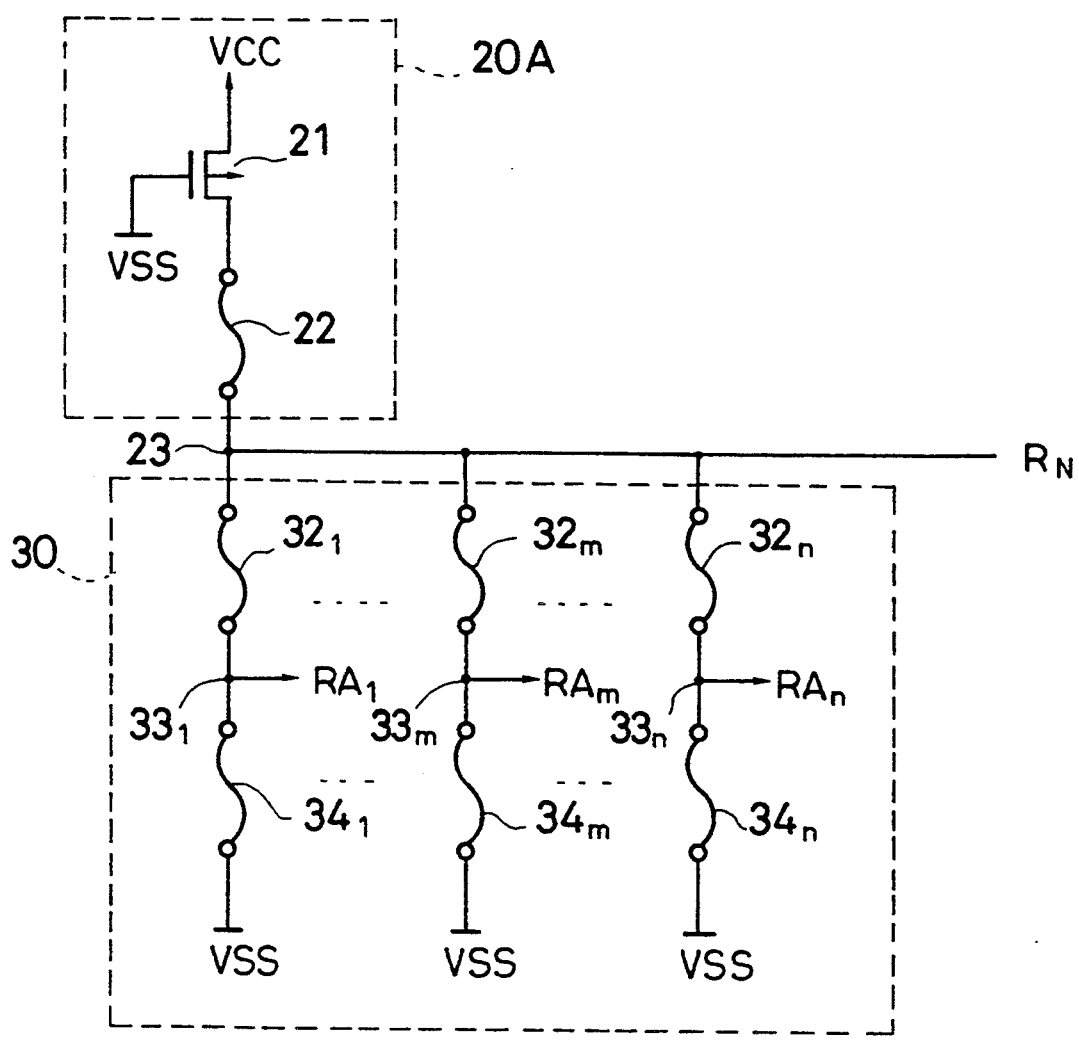
FIG. 4 is a schematic diagram illustrating another novel fuse-programmable control circuit.

FIG. 4 shows another variation of the invention. The master control circuit 20A in FIG. 4 is identical to the master control circuit 20 in FIG. 1 with the removal of the second fusible link 24 and inverter 25. The PMOS transistor 29 has also been removed; the fuse-programmable memory 30 is coupled directly to the master output terminal 23. The operation of this circuit will be explained below.

During testing, all the fusible links in FIG. 4 are left uncut. Current flows from VCC through the PMOS transistor 21 and first fusible link 22, then through all the fusible links in the fuse-programmable memory 30 to VSS, the PMOS transistor 21 acting to limit the current flow. Due to the resistance of the PMOS transistor 21, the control signal $R_N$ is low (inactive), permitting normal circuit elements to be tested.

If tests reveal no defects, the first fusible link 22 is cut and the fusible links in the fuse-programmable memory 30 are left uncut. As a result, no current flows through the master control circuit 20A and fuse-programmable memory 30, and the control signal $R_N$ is still low (inactive), being coupled through the fuse-programmable memory 30 to VSS.

If a defective element is discovered, its address is programmed into the fuse-programmable memory 30 as before, and the first fusible link 22 is left uncut. Once again current flow from VCC to VSS through the master control circuit 20A and fuse-programmable memory 30 is blocked, because one fusible link in each pair of fusible links in the fuse-programmable memory 30 is cut. The fuse-programmable signals $RA_1, \ldots, RA_n$ indicate the address of the defective element. The control signal $R_N$ is high (active), being coupled through the first fusible link 22 and PMOS transistor 21 to VCC.

In both the defective and non-defective cases, the control circuit in FIG. 4 provides the same fuse-programmable signals $RA_1, \ldots, RA_n$ and control signal $R_N$ (which is also fuse-programmable) as did the control circuit in FIG. 1.

Many further modifications to the circuits shown in the drawings are possible. For example, the positions of the PMOS transistor 21 and first fusible link 22 in FIG. 1 can be interchanged. Similarly, the positions of the first fusible link 22 and NMOS transistor 27 in FIG. 3 can be interchanged. The PMOS transistor 21 in FIG. 1 and NMOS transistor 27 in FIG. 3 can be replaced with current-limiting resistors. VSS and VCC can be interchanged, the PMOS transistors 21 and 29 being replaced by NMOS transistors and the NMOS transistor 27 by a PMOS transistor. The fuse-programmable memory 30 can be programmed to store a plurality of defective addresses instead of just one, suitable modifications being made to the address comparator 40 and decision circuit 50 in FIG. 2. The invention can be applied to integrated circuits other than semiconductor memory devices. These and other modifications, which will be apparent to those skilled in the art, can be made without departing from the scope of the invention as claimed below.

What is claimed is:

1. A fuse-programmable control circuit for generating fuse-programmable signals in an integrated circuit, comprising:
   a master control circuit having two fusible links coupled in series between a first potential and a second potential, for generating a control signal from a point between said two fusible links, one of said two fusible links being cut to activate said control signal if said fuse-programmable signals are required, and another of said two fusible links being cut to deactivate said control signal if said fuse-programmable signals are not required;
   a switching element controlled by said control signal, coupled to supply said first potential when switched on by said control signal; and
   a fuse-programmable memory having a plurality of pairs of fusible links, each pair coupled in series between said switching element and said second potential, and a like plurality of output terminals, each output terminal disposed between the fusible links in a corresponding pair, for generating said fuse-programmable signals from said output terminals by cutting of one or another of the fusible links in respective pairs of fusible links.

2. The circuit of claim 1, wherein said fuse-programmable signals are used to select redundant elements to replace defective elements of said integrated circuit.

3. The circuit of claim 1, wherein said master control circuit also has a current-limiting element coupled in series with said two fusible links, for limiting current flow when neither of said two fusible links is cut.

4. The circuit of claim 3, wherein said current-limiting element is a transistor that is permanently switched on.

5. The circuit of claim 3, wherein said current-limiting element is disposed between said first potential and said two fusible links.

6. The circuit of claim 3, wherein said current-limiting element is disposed between said second potential and said two fusible links.

7. The circuit of claim 1, wherein said switching element is a field-effect transistor with a gate electrode coupled to receive said control signal, a source electrode coupled to said first potential, and a drain electrode coupled to the pairs of fusible links in said fuse-programmable memory.

8. The circuit of claim 1, wherein said master control circuit also has an inverter coupled to said two fusible links for inverting said control signal.

9. A fuse-programmable control circuit for generating fuse-programmable signals in an integrated circuit, comprising:
   a master control circuit having a first fusible link coupled to a first potential, said first fusible link being cut if said fuse-programmable signals are not required, and left uncut if said fuse-programmable signals are required; and
   a fuse-programmable memory having a plurality of pairs of fusible links, each pair coupled in series between said first fusible link and a second potential, and a like plurality of output terminals, each output terminal disposed between the fusible links in a corresponding pair, for generating said fuse-programmable signals from said output terminals by cutting of one or another of the fusible links in respective pairs of fusible links.

10. The circuit of claim 9, wherein said fuse-programmable signals are used to select redundant elements to replace defective elements of said integrated circuit.

11. The circuit of claim 9, wherein said master control circuit also has a current-limiting element coupled in series with said first fusible link between said first potential and the fusible links in said fuse-programmable memory.

12. The circuit of claim 11, wherein said current-limiting element is disposed between said first potential and said first fusible link.

13. The circuit of claim 11, wherein said current-limiting element is a transistor that is permanently switched on.

14. The circuit of claim 9, wherein a control signal for indicating whether said fuse-programmable signals are valid or invalid is output from a point between said first fusible link and said fuse-programmable memory.

15. A method of generating fuse-programmable signals in an integrated circuit, comprising the steps of:
- if said fuse-programmable signals are required, programming them by cutting one fusible link in each of a plurality of pairs of fusible links in a fuse-programmable memory;
- if said fuse-programmable signals are required, leaving a first fusible link uncut, thereby supplying power to said fuse-programmable memory;
- if said fuse-programmable signals are not required, leaving the pairs of fusible links in said fuse-programmable memory uncut; and
- if said fuse-programmable signals are not required, cutting said first fusible link, thereby cutting off power to said fuse-programmable memory.

16. The method of claim 15, wherein said fuse-programmable signals are used to select redundant elements to replace defective elements of said integrated circuit.

17. The method of claim 15, wherein power is fed to said fuse-programmable memory through said first fusible link.

18. The method of claim 17, comprising the further step of generating a control signal, indicating whether said fuse-programmable signals are valid or invalid, from a point between said first fusible link and said fuse-programmable memory.

19. The method of claim 15, comprising the further steps of:
- if said fuse-programmable signals are required, cutting a second fusible link coupled in series with said first fusible link;
- generating a control signal from a point between said first fusible link and said second fusible link;
- using said control signal to control a switching element; and
- feeding power through said switching element to said fuse-programmable memory.

20. The method of claim 19, comprising the further step of using said control signal to indicate whether said fuse-programmable signals are valid or invalid.

* * * * *